US010079228B1

(12) United States Patent
Balakrishnan et al.

(10) Patent No.: US 10,079,228 B1
(45) Date of Patent: Sep. 18, 2018

(54) TIGHT INTEGRATED VERTICAL TRANSISTOR DUAL DIODE STRUCTURE FOR ELECTROSTATIC DISCHARGE CIRCUIT PROTECTOR

(71) Applicant: INTERNATIONAL BUSINESS MACHINES CORPORATION, Armonk, NY (US)

(72) Inventors: Karthik Balakrishnan, White Plains, NY (US); Bahman Hekmatshoartabari, White Plains, NY (US); Alexander Reznicek, Troy, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/463,795

(22) Filed: Mar. 20, 2017

(51) Int. Cl.
*H01L 27/02* (2006.01)
*H01L 29/78* (2006.01)
(Continued)

(52) U.S. Cl.
CPC ...... *H01L 27/0255* (2013.01); *H01L 29/0649* (2013.01); *H01L 29/0688* (2013.01);
(Continued)

(58) Field of Classification Search
CPC ....... H01L 2924/00; H01L 2924/00014; H01L 2924/0002; H01L 29/872; H01L 29/0619;
(Continued)

(56) References Cited

U.S. PATENT DOCUMENTS 6,337,499 B1 * 1/2002 Werner ............... H01L 29/0634 257/329
7,368,757 B2 5/2008 Komiyama et al.
(Continued)

OTHER PUBLICATIONS

Moroz, V. et al., "Modeling and Optimization of Group IV and III-V FinFETs and Nano-Wires" 2014 IEEE International Electron Devices Meeting (IEDM) (Dec. 2014) pp. 7.4.1-7.4.4.
(Continued)

*Primary Examiner* — Steven Loke
*Assistant Examiner* — Juanita Rhodes
(74) *Attorney, Agent, or Firm* — Tutunjian & Bitetto, P.C.; Louis J. Percello

(57) ABSTRACT

An electric static discharge (ESD) diode pair is disclosed. The first diode of the device includes a first diode junction portion having vertically orientated and horizontally oriented portions of a first conductivity and a second diode junction portion of a second conductivity in direct contact with both of the vertically orientated and horizontally orientated portions of the first diode junction portion. The second diode of the device includes a first diode junction portion having vertically orientated and horizontally oriented portions of a second conductivity and a second diode junction portion having a first conductivity in direct contact with both of the vertically orientated and horizontally orientated portions of the first diode junction portion. A common electrical contact is in direct contact first diode junction portion for each of the first diode and the second diode.

20 Claims, 11 Drawing Sheets

90 95 100 34a 35 46 34b 50b 50a 45a 25a 30 25b 45b 40 20a 24 20b 15a 15b 10

(51) Int. Cl.

| | |
|---|---|
| ***H01L 29/861*** | (2006.01) |
| ***H01L 29/06*** | (2006.01) |
| ***H01L 29/66*** | (2006.01) |
| ***H01L 29/16*** | (2006.01) |
| ***H01L 29/45*** | (2006.01) |

(52) U.S. Cl.

CPC .......... *H01L 29/0692* (2013.01); *H01L 29/16* (2013.01); *H01L 29/45* (2013.01); *H01L 29/66136* (2013.01); *H01L 29/7827* (2013.01); *H01L 29/8613* (2013.01)

(58) Field of Classification Search

CPC ............... H01L 27/0255; H01L 29/861; H01L 29/0646; H01L 21/761; H01L 27/0814; H01L 29/7827; H01L 29/8613; H01L 29/0688; H01L 29/66136; H01L 29/16; H01L 29/0692; H01L 29/0649; H01L 29/45

See application file for complete search history.

(56) References Cited

U.S. PATENT DOCUMENTS 9,502,584 B1 * 11/2016 Chang ............... H01L 29/66136
2006/0071236 A1 * 4/2006 Jensen ................ H01L 29/7302
257/133

OTHER PUBLICATIONS

Chun, J.-H. et al., "ESD Protection Circuits for Advanced CMOS Technologies" A Dissertation submitted to the Dept. of Electrical Engineering and the Committee on Graduate Studies of Stanford University (Jun. 2006) pp. 1-137.

* cited by examiner 20a
15a
10

95
20b
15b
24
10
90
20a
15a

TIGHT INTEGRATED VERTICAL TRANSISTOR DUAL DIODE STRUCTURE FOR ELECTROSTATIC DISCHARGE CIRCUIT PROTECTOR

BACKGROUND

Technical Field

The present disclosure relates to vertical transistors and electrostatic discharge circuit protectors.

Description of the Related Art

Modern integrated circuits are made up of literally millions of active devices such as transistors and memory devices. The geometry of vertical transistors is attractive due to their potential density with increased scaling requirements. Further vertical transistors can allow for relaxed gate lengths to better control electrostatics.

SUMMARY

In one embodiment, the methods and structures that are described herein provide an electric static discharge (ESD) diode pair using a vertical transistor compatible architecture and process flow. In one embodiment, the electrical device includes a first region of a substrate and a second region of the substrate. A first diode is present in a first region of the substrate, the first diode including a first diode junction portion having vertically orientated and horizontally oriented portions of a first conductivity and a second diode junction portion of a second conductivity in direct contact with both of the vertically orientated and horizontally orientated portions of the first diode junction portion. A second diode is present in a second region of the substrate, the second diode including a first diode junction portion having vertically orientated and horizontally oriented portions of a second conductivity and a second diode junction portion having a first conductivity in direct contact with both of the vertically orientated and horizontally orientated portions of the first diode junction portion. A common electrical contact is in direct contact first diode junction portion for each of the first diode and the second diode.

In another embodiment, the electrical device includes a first region of a substrate and a second region of the substrate. A first diode is present in a first region of the substrate, the first diode including a first diode junction portion having an L-shaped geometry with vertically orientated portions and horizontally orientated portions having a first conductivity type and a second diode junction portion having a second conductivity type in contact with the first diode junction portion having the L-shaped geometry and the first conductivity type. A second diode is present in a second region of the substrate, the second diode including a first diode junction portion having an L-shaped geometry with vertically orientated and horizontally oriented portions having a second conductivity type and a second diode junction portion in contact with first diode junction portion having the L-shaped geometry and the second conductivity type. A common electrical contact is in direct contact with the vertically oriented portions having the first conductivity type and the second conductivity type for the first and second diodes.

In another aspect, a method of forming an electric static discharge (ESD) diode pair is described herein that uses a vertical transistor architecture and vertical transistor process flow. In one embodiment, the method may include forming a first diode including a first diode junction portion having vertically orientated and horizontally oriented portions with a first conductivity type and a second diode junction portion in direct contact with both of the vertically orientated and horizontally orientated portions of the first diode junction portion. A second diode may be formed in a second region of the substrate, the second diode including a first diode junction portion having vertically orientated and horizontally oriented portions of a second conductivity type and a second diode junction portion having a first conductivity type in direct contact with both of the vertically orientated and horizontally orientated portions of the first diode junction portion having the second conductivity type. A common electrical contact is formed in direct contact with the vertically oriented portions of the first diode junction portions for the first and second diodes.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
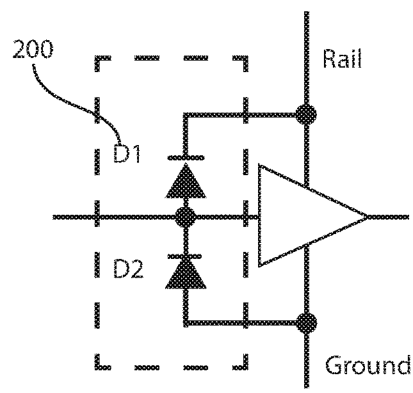
FIG. 1 is a circuit diagram of one embodiment of a circuit diode pair.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The term "conductivity type" when used to describe a region or a material denotes that the semiconductor material or the semiconductor material within the region being referred has been doped to an n-type or p-type conductivity. As used herein, "P-type" refers to the addition of impurities to an intrinsic semiconductor that creates deficiencies of valence electrons, such as the addition of boron, aluminum, or gallium to a type IV semiconductor, such as silicon. As used herein, "N-type" refers to the addition of impurities to an intrinsic semiconductor that contribute free elections, such as the addition of antimony, arsenic, or phosphorous to a type IV semiconductor, such as silicon.

With increasing scaling for next generation semiconductor devices, vertical field effect transistors (vFETs) have become increasingly attractive. For example, vertical FET devices are attractive for 5 nm device architecture due to sub-30 nm fin pitch and since they are not constrained by the contact poly pitch (CPP) and gate width scaling. Vertical transistors are attractive candidates for 5 nm node and beyond due to their potential of better density scaling and allowing relaxed gate lengths to better control the electrostatics.

Figure 2:
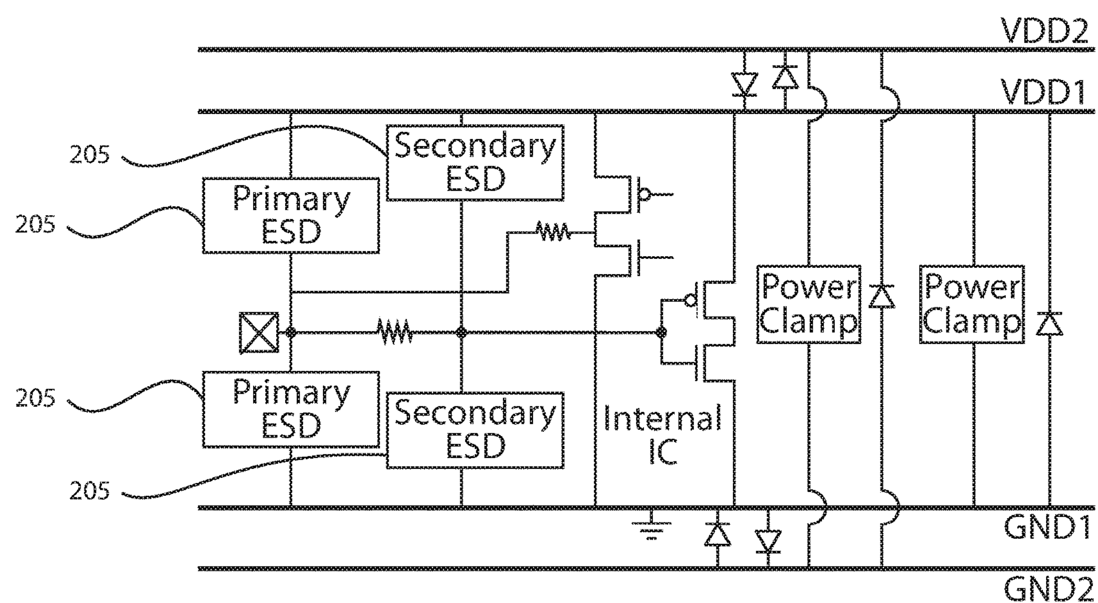
FIG. 2 is a circuit diagram of one embodiment of a plurality of electrostatic discharge (ESD) diode pairs in an electrical device circuit.

It has been determined that fabricating a high-density, integrated diode pair with minimal changes to the VFET process flow can be useful for electrostatic discharge (ESD) applications. The methods and structures described herein provide an ESD diode pair using a vertical transistor-compatible architecture and process flow. This enables savings in the area occupied by the device on a substrate, which may be referred to as foot print savings, in comparison to planar device orientations. A circuit diagram for an ESD diode pair 200 is provided in FIG. 1. The savings in space provided by the vertically orientated device elements that are provided by the vertical transistor-compatible architecture and process flow is especially advantageous for devices that include multiple ESD protecting devices 205, as illustrated in the circuit diagram depicted in FIG. 2.

In some embodiments, the methods and structures described herein also can provide for space saving in the back end of the line (BEOL) wiring by providing at least some connections to the diodes in the front end of the line (FEOL) level. In some embodiments, the use of a cut mask to create a shallow trench isolation (STI) region in the ESD diode composed of two vertically orientated transistor like devices enables a tight pitch between the fin structures within the ESD diode. The diode pair of the ESD device is integrated back to back using a contact similar to a gate conductor produced using a vertically orientated field effect transistor (VFET) process flow. This reduces the amount of electrical contacts that need to be produced during back end of the line processing, which in turn can reduce the foot print of the device. Some embodiments of structures disclosed herein, are now described in more detail with reference to FIGS. 3A-3B.

Figure 3A:
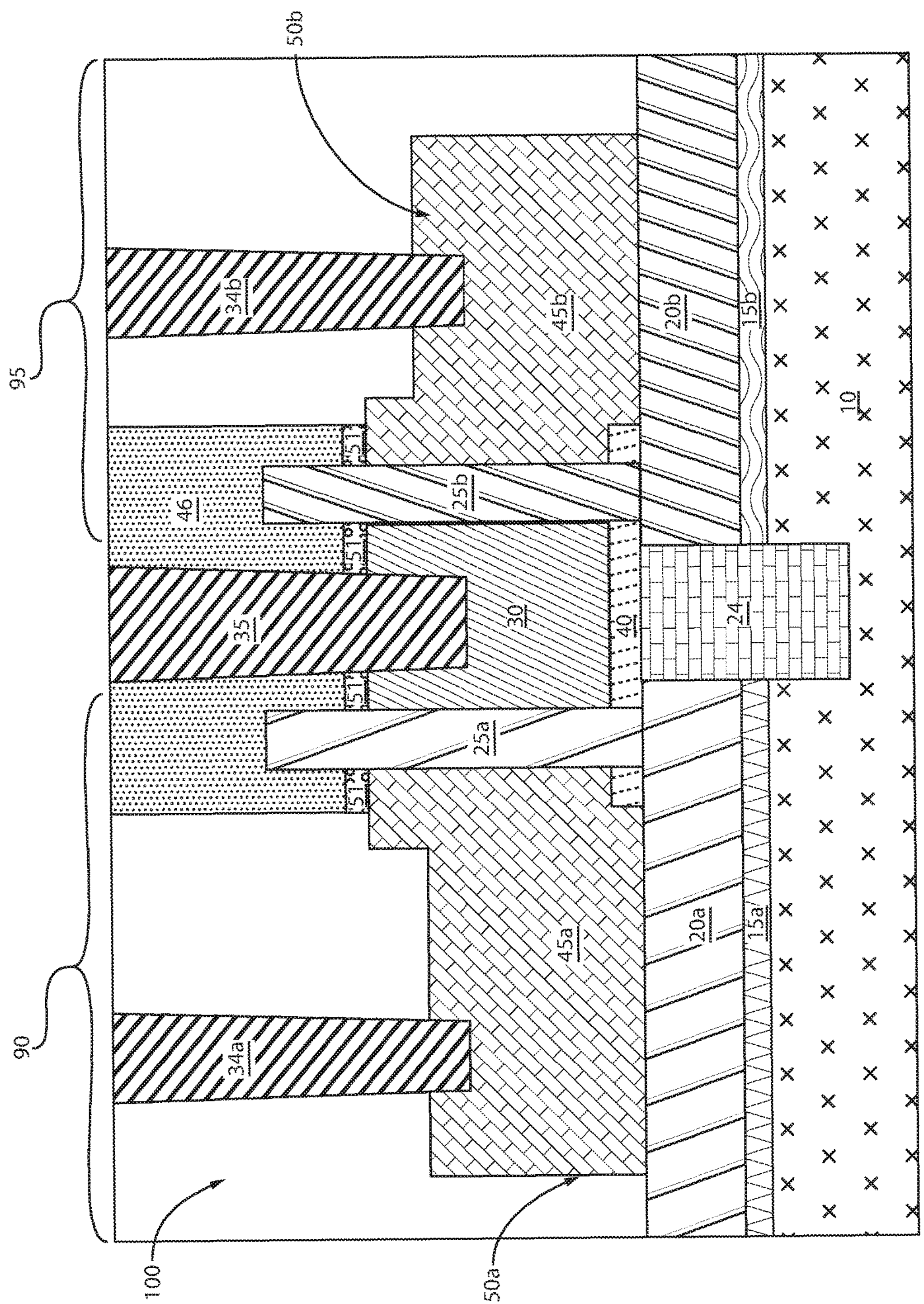
FIG. 3A is a side cross-sectional view of one embodiment of an electrostatic discharge (ESD) diode pair that includes a vertical transistor architecture, in accordance with one embodiment of the present disclosure.
Figure 3B:
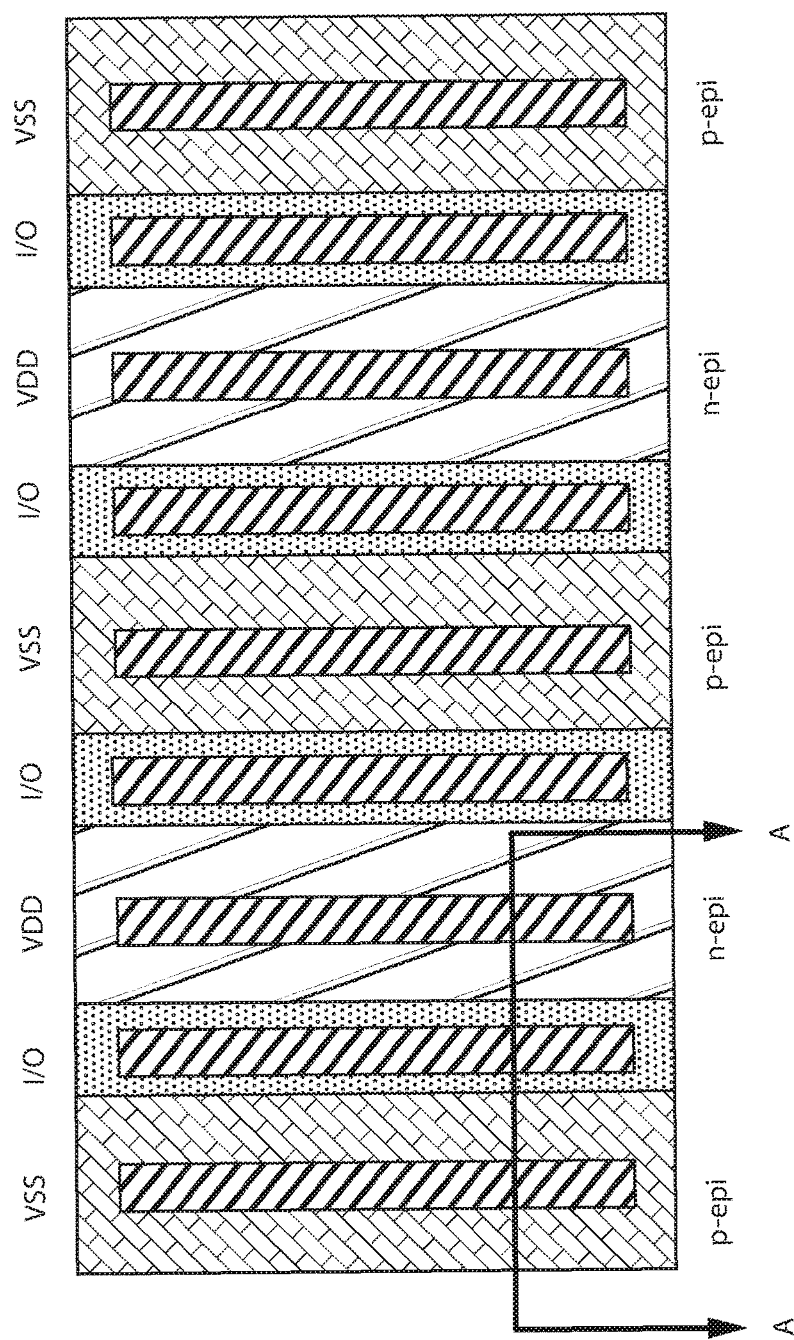
FIG. 3B is a top down view of the structure depicted in FIG. 3A, in which the structure depicted in FIG. 3A is along section line A-A of FIG. 3B.

Referring to FIGS. 3A and 3B, in some embodiments, the methods and structures that are described herein provide an electric static discharge (ESD) diode pair 100 using a vertical transistor compatible architecture. The electrical device may include a first region 90 of a substrate 10 including a first diode 50*a*, and a second region 95 of the substrate 10 including a second diode 50*b*. The first diode 50*a* includes a first diode junction portion 20*a*, 25*a* having an L-shaped geometry with vertically orientated portions 25*a* and horizontally orientated portions 20*a* having a first conductivity type, and a second diode junction portion 45*a* in direct contact with both of the vertically orientated and horizontally orientated portions 20*a*, 25*a* of the first diode junction portion. In one embodiment, the first diode junction portion 20*a*, 25*a* of the first diode 50*a* has a conductivity type, i.e., first conductivity type, that is n-type; and the second diode junction portion 45*a* of the first diode 50*a* is p-type, i.e., the second conductivity type is p-type.

The term "L-shaped" geometry denotes a side-cross sectional geometry of the first diode junction portions 20*a*, 20*b*, 25*a*, 25*b* for the first and second diode 50*a*, 50*b* when view along section line A-A of FIG. 3B. An end portion of the vertically orientated portions 25*a*, 25*b* are in direct contact with an end portion of the horizontally orientated portions 20*a*, 20*b*.

The first diode junction portion 20*a*, 25*a* having the first conductivity type, and the second diode junction portion 45*a* having the second conductivity type may provide a first p-n junction for the first diode 50*a*. In the embodiment depicted in FIG. 3A, the p-type second conductivity portion 45*a* is in direct contact with the ground contact (VSS) or 0 volt supply; and the n-type first conductivity portions 20*a*, 25*a* is in direct contact with the input/output contact, which is a common contact to both the first diode 50*a* and the second diode 50*b*.

Referring to FIGS. 3A and 3B, the second diode 50*b* that is present in the second region 95 of the substrate may include a first diode junction portion 20*b*, 25*b* having an L-shaped geometry with a vertically orientated portion 25*b* and horizontally oriented portion 20*b* each having a second conductivity type, and a second diode junction portion 45*b* having a second conductivity type that is in direct contact with both of the vertically orientated and horizontally orientated portions of the first junction diode portion 20*b*, 25*b* of the second diode 50*b* In one embodiment, the first diode junction portion 20*b*, 25*b* of the second diode 50*b* has a second conductivity type that is p-type; and the second junction diode portion 45*b* of the second diode 50*b* has a first conductivity type that is n-type.

The first diode junction portion 20*b*, 25*b* having the second conductivity type, and the second diode junction portion 45*b* having the first conductivity type may provide a second p-n junction for the second diode 50*b*. In the embodiment depicted in FIGS. 3A and 3B, the n-type second diode junction portion 45*b* is in direct contact with the positive power supply contact (VDD); and the p-type first diode junction portion 20*b*, 25*b* is in direct contact with the input/output contact, which is a common contact to both the first diode 50*a* and the second diode 50*b*.

Each of the first diode 50*a* and the second diode 50*b* may each include a horizontally orientated portion 20*a*, 20*b* of the first diode junction portion that may be provided by or deposited upon an upper surface of a substrate 10 composed of a semiconductor material. More specifically, the horizontally orientated portions 20*a*, 20*b* may be a semiconductor material layer that was an upper surface of a semiconductor substrate that was doped, e.g., by ion implantation; or was deposited atop a semiconductor substrate and doped either by in situ doping or ion implantation or a combination thereof.

In some embodiments, the horizontally orientated portion 20*a*, 20*b* of the first diode junction portion 20*a*, 20*b*, 25*a*, 25*b* for each of the first and second diodes 50*a*, 50*b* is separated from the supporting semiconductor substrate 10 by a counter doped region 15*a*, 15*b*. The term "counter doped" means that the counter doped region 15*a*, 15*b* has an opposite conductivity type as the horizontally orientated portion 20*a*, 20*b* of the first diode junction portion 20*a*, 20*b*, 25*a*, 25*b* for each of the first and second diodes 50*a*, 50*b*. For example, in the first device region 90, when the horizontally orientated portion 20*a* is doped to an n-type conductivity, the counter doped region 15*a* that is present in the first region 90 has a p-type conductivity; and when the horizontally orientated portion 20*b* that is present in the second region 95 has a p-type conductivity, the counter doped region 15*b* may have an n-type conductivity.

Although the supporting substrate 10 is depicted as a bulk substrate, in other embodiments, the supporting substrate 10 may be a semiconductor on insulator (SOI) substrate. As will be further described below the horizontally orientated portion 20*a*, 20*b* of the first diode junction portion 20*a*, 20*b*, 25*a*, 25*b* for each of the first and second diodes 50*a*, 50*b*, and the counter doped regions 15*a*, 15*b* may be formed by ion implantation into the supporting substrate 10 or epitaxial growth atop the supporting substrate 10.

The horizontally orientated portion 20*a*, 20*b* of the first diode junction portion 20*a*, 20*b*, 25*a*, 25*b* for each of the first and second diodes 50*a*, 50*b*, the counter doped regions 15*a*, 15*b*, and the supporting substrate 10 may each be composed of a semiconductor material, such as a type IV or type III-V semiconductor. Examples of type IV semiconductors that are suitable for use as the base material for the horizontally orientated portion 20*a*, 20*b* of the first diode junction portion for each of the first and second diodes 50*a*, 50*b*, the counter doped regions 15*a*, 15*b*, and the supporting substrate 10 may include silicon (Si), crystalline silicon (c-Si), monocrystalline silicon, germanium, silicon germanium (SiGe), silicon doped with carbon (Si:C), silicon germanium doped with carbon (SiGe:C) and a combination thereof, and similar semiconductors, e.g., semiconductor materials including at least one element from Group IVA (i.e., Group 14) of the Periodic Table of Elements. Examples of type III-V materials can include gallium arsenic (GaAs).

In some embodiments, when the horizontally orientated portion 20*a* of the first diode junction portion 20*a*, 25*a* for the first diode 50*a* is n-type, the n-type dopant may be present in a concentration ranging from $1\times10^{19}$ dopants/cm$^3$ to $4\times10^{20}$ dopants/cm$^3$. In some embodiments, when the horizontally orientated portion 20*b* of the second diode junction portion 20*b*, 25*b* for the first diode 50*b* is p-type, the p-type dopant may be present in a concentration ranging from $1\times10^{17}$ dopants/cm$^3$ to $1\times10^{19}$ dopants/cm$^3$.

Referring to FIGS. 3A and 3B, the first region 90 of the substrate may be separated from the second region 95 of the substrate by an isolation region 24, such as a shallow trench isolation (STI) region. The isolation region 24 may be composed of a dielectric material, such as an oxide, e.g., silicon oxide, or a nitride, e.g., silicon nitride.

Each of the first and second diodes 50*a*, 50*b* may include a vertically orientated portion 25*a*, 25*b* of the first diode junction portion 20*a*, 25*a*, 20*b*, 25*b* for each device. The vertically orientated portion 25*a*, 25*b* of the first diode junction portion 20*a*, 25*a*, 20*b*, 25*b* for each device may be provided by semiconductor fin structure. Similar to the horizontally orientated portions 20*a*, 20*b* of the first diode junction portion 20*a*, 25*b*, 20*b*, 25*b* for each of the diodes 50*a*, 50*b*, each of the semiconductor fin structures may be composed of a semiconductor material, e.g., a type IV semiconductor material, such as silicon or germanium, or a type III-V semiconductor material, such as gallium arsenic (GaAs). The semiconductor fin structures may have a height ranging from 10 nm to 200 nm. In another embodiment, each of the fin structures has a first height ranging from 20 nm to 100 nm. In one example, each of the fin structures has a height ranging from 30 nm to 50 nm. Each of fin structures may have a width ranging from 5 nm to 20 nm. In another embodiment, each of the fin structures has a width ranging from 6 nm to 12 nm. In one example, each fin structure has a width that is equal to 8 nm. The pitch separating adjacent fin structures may range from 10 nm to 50 nm. In another embodiment, the pitch separating adjacent fin structures may range from 25 nm to 40 nm. In one example, the pitch is equal to 30 nm. The pitch selected for the adjacent fin structures may be less than the contacted gate pitch, i.e., the pitch may be equal to a minimum non-contacted gate pitch or less.

The semiconductor fin structure that provides the vertically orientated portion 25*a* of the first diode junction portion 20*a*, 25*a* of the first diode 50*a* typically has a same conductivity type as the horizontally orientated portion 20*a* for the first diode junction portion 20*a*, 25*a*. For example, when the horizontally orientated portion 20*a* for the first diode junction portion 20*a*, 25*a* of the first diode 50*b* is n-type, the vertically orientated portion 25*a* for the first diode junction portion 20*a*, 25*a* is n-type. In some embodiments, when the vertically orientated portion 25*a* of the first diode junction portion 20*a*, 25*a* for the first diode 50*a* is n-type, the n-type dopant may be present in a concentration ranging from $1\times10^{19}$ dopants/cm$^3$ to $4\times10^{20}$ dopants/cm$^3$. For example, when the horizontally orientated portion 20*b* for the first diode junction portion 20*b*, 25*b* of the second diode 50*b* is p-type, the vertically orientated portion 25*b* for the first diode junction portion 20*b*, 25*b* for the second diode 50*b* is p-type. In this example, the p-type dopant may be present in a concentration ranging from $1\times10^{17}$ dopants/cm$^3$ to $1\times10^{19}$ dopants/cm$^3$.

The vertically orientated portion 25*a*, 25*b* of the first diode junction portion 20*a*, 25*a*, 20*b*, 25*b* for each of the first and second diodes 50*a*, 50*b* is in an epitaxially formed relationship with the horizontally orientated portions 20*a*, 20*b* of the first and second diodes 50*a*, 50*b*. For example, if the horizontally orientated portions 20*a*, 20*b* have a monocrystalline crystal structure, the vertically orientated portions 25*a*, 25*b* have a monocrystalline crystal structure. For example, if the material compositions for the vertical and horizontally orientated portions 20*a*, 20*b*, 25*a*, 25*b* are substantially similar, the lattice structure for the vertically orientated portions 25*a*, 25*b* will substantially match the lattice structure of the horizontally orientated portions 20*a*, 20*b*.

A common electrical contact 30 is in direct contact with the vertically oriented portions 25*a*, 25*b* of the first diode junction portion 20*a*, 20*b*, 25*a*, 25*b* for the first and second diodes 50*a*, 50*b*. The common electrical contact 30 is a single structure of an electrically conductive material that is simultaneously in contact with a portion of the first diode junction portion 20*a*, 25*a*, 20*b*, 25*b* for each of the first diode 50*a* and the second diode 50*b*. The common electrical contact 30 may be composed of a metal or a doped semiconductor, e.g., n-type doped polysilicon. The metal of the common electrical contact 30 may be composed of TiAl, TaN, TiN, HfN, HfSi, TiAlN, Ru, Pt, Mo, Co and alloys and combinations thereof.

Still referring to FIGS. 3A and 3B, the common electrical contact 30 may be separated from the STI 24, by a first dielectric spacer 40 (which may be referred to as the bottom spacer) and a second dielectric spacer 51 (which may be referred to as the top spacer) may be formed atop the common electrical contact 30. Each of the first and second dielectric spacer 40, 51 may be composed of an oxide, such as silicon oxide, nitride, such as silicon nitride or a combination thereof.

The second diode junction region 45*a*, 45*b* is present in direct contact with the first diode junction portion 20*a*, 20*b*, 25*a*, 25*b* for each of the first diode 50*a* and the second diode 50*b*. The second diode junction portion 45*a*, 45*b* typically has the opposing conductivity type as the corresponding first diode junction portion 20*a*, 20*b*, 25*a*, 25*b*. For example, if the first diode junction portion 20*a*, 25*a* for the first diode 50*a* is doped to an n-type conductivity, the second diode junction portion 45*a* for the first diode 50*b* is doped to a p-type conductivity. For example, if the first diode junction portion 20*b*, 25*b* for the second diode 50*b* is doped to a p-type conductivity, the second diode junction portion 45*b* for the second diode 50*b* is doped to an n-type conductivity.

Similar to the first diode junction portion 20*a*, 20*b*, 25*a*, 25*b*, the second diode portion 45*a*, 45*b* may be composed of a semiconductor material, e.g., a type IV semiconductor materials, such as silicon (Si) or germanium (Ge), or a type III-V semiconductor material, such as gallium arsenide (GaAs). In some embodiments, the second diode portions 45*a*, 45*b* are formed using an epitaxial deposition process atop an exposed surface of the vertical orientated portions 25*a*, 25*b* and the horizontally orientated portions 20*a*, 20*b* of the first diode junction portion 20*a*, 20*b*, 25*a*, 25*b*.

In some embodiments, when the second diode portions 45*a*, 45*b* is n-type, the n-type dopant may be present in a concentration ranging from $1\times10^{19}$ dopants/$cm^3$ to $4\times10^{20}$ dopants/$cm^3$. In some embodiments, when the second diode portions 45*a*, 45*b* is p-type, the p-type dopant may be present in a concentration ranging from $1\times10^{17}$ dopants/$cm^3$ to $1\times10^{19}$ dopants/$cm^3$.

Still referring to FIGS. 3A and 3B, the ESD diode pair device 100 may also include a dielectric layer 46 encapsulating the device, wherein via contacts 34*a*, 34*b*, 35 to the second extend through the dielectric layer 46. Referring to FIG. 3B, in some embodiments, a common via contact 35 extends through the dielectric layer 46 to the common electrical contact 30 that is in direct contact with the first diode junction portion 20*a*, 25*a*, 20*b*, 25*b* for each of the first and second diodes 50*a*, 50*b*. In some embodiments, a first via contact 34*a* is in direct contact with the second diode junction portion 45*a* of the first diode 50*a*, and a second via contact 34*b* is in direct contact with the second diode junction portion 45*b* of the second diode 50*b*, in which the first and second contact 34*a*, 34*b* are separate from one another. The first via contact 34*a* is in direct contact with the ground contact (VSS) or 0 (zero) volt supply; and the second via contact 34*b* in direct contact with the positive power supply contact (VDD). Some embodiments of methods for forming the structures depicted in FIGS. 3A and 3B are now described in greater detail with further reference to FIGS. 4-12.

Figure 4:
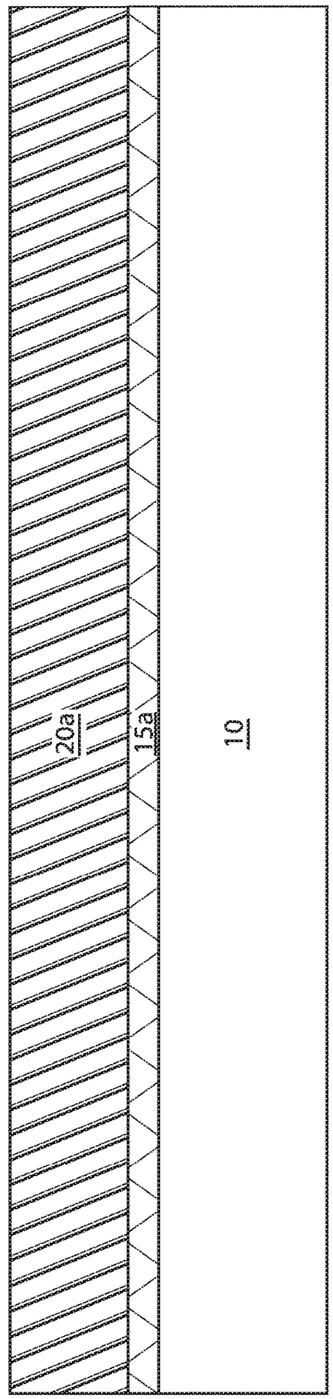
FIG. 4 is a side cross-sectional view depicting one embodiment of an initial material stack used in forming an electrostatic discharge (ESD) diode pair, in accordance with the present disclosure.

FIG. 4 depicts one embodiment of an initial material stack used in forming an ESD diode pair device 100. In some embodiments, the initial material stack includes a supporting substrate 10, a counter doped layer 15*a*, and a material layer for provide the horizontal portion 20*a* for the first diode junction portion 20*a*, 25*a* for the first diode 50*a*. The supporting substrate 10 has been described above with reference to FIGS. 3A and B. The counter doped layer 15*a* may be formed on the upper surface of the supporting substrate 10 by ion implantation into the upper surface of the supporting substrate 10 or by epitaxial growth in combination with in situ doping or ion implantation. The counter doped layer 15*a* depicted in FIG. 4 is processed to provide the counter doped layer 15*a* within the first region 90 of the structure depicted in FIGS. 3A and 3B. Therefore, in this example, the counter doped layer 15*a* is doped to a p-type conductivity. The counter doped layer 15*a* may have a thickness ranging from 5 nm to 50 nm. The material layer for providing the first source/drain regions 20*a* may also be formed using ion implantation or epitaxial growth in combination with ion implantation or in situ doping. The material layer for providing the horizontal portion 20*a* for the first diode junction portion 20*a*, 25*a* for the first diode 50*a* is typically doped to an n-type conductivity. The thickness for the material layer for providing the horizontal portion 20*a* for the first diode junction portion 20*a*, 25*a* for the first diode 50*a* typically has a thickness ranging from 10 nm to 100 nm.

Figure 5:
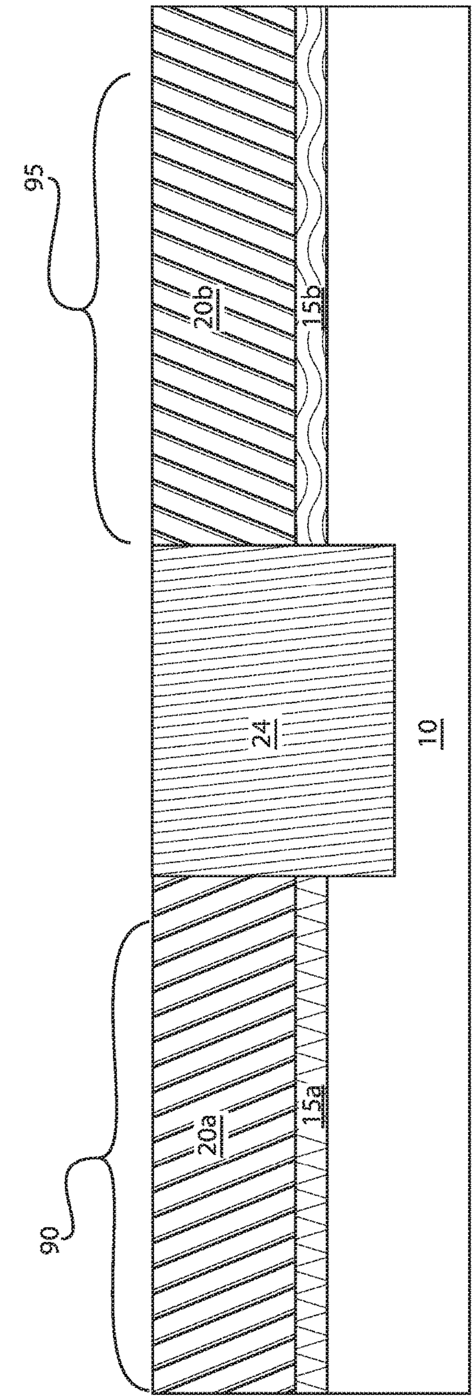
FIG. 5 is a side cross-sectional view depicting one embodiment of processing the structure depicted in FIG. 4 to provide a first region for a first diode and a second region for a second diode, in accordance with present disclosure.

FIG. 5 depicts one embodiment the structure depicted in FIG. 4 following processing to provide a first region 90 and a second region 95. An isolation region 24 is formed to isolate the first region 90 from the second region 95. The isolation region 24 is formed by etching a trench, e.g., by reactive ion etch, through the material layers for the first counter doped layer 15*a*, and the material layer for the horizontal portion 20*a* for the first diode junction portion 20*a*, 25*a* for the first diode 50*a* into the supporting substrate 10. The trench is then filled with a dielectric material, such as an oxide, e.g., silicon oxide ($SiO_2$), or a nitride, such as silicon nitride. The deposition process may be a chemical vapor deposition process.

Following formation of the isolation region 24, the portion of the structure that provides the first region 90 may be protected by forming an etch mask thereon, while the portions of the first counter doped layer 15*a* and the material layer for the horizontal portion 20*a* for the first diode junction portion 20*a*, 25*a* for the first diode 50*a* that are exposed by the etch mask are removed from the second region 95, e.g., via etch process. The etch mask may be a photoresist mask that is patterned using photolithography.

The etch mask may also be provided by a hard mask, e.g., a mask composed of a dielectric material layer, such as silicon nitride. The etch process or removing the exposed portions of the first counter doped layer 15*a*, and the material layer for the horizontally orientated portion 20*a* of the first diode junction portion that are present in the second region 95 may be removed by an etch process, such as a selective etch process, e.g., an etch process that is selective to the supporting substrate 10. In some embodiments, the etch process may be an anisotropic etch process, such as reactive ion etch.

Still referring to FIG. 4, the second counter doped layer 15*a*, and the material layer for providing the horizontally orientated portion 20*b* of the first diode junction portion 20*b*, 25*b* for the second diode 50*b* may be formed on the portion of the supporting substrate 10 that is present in the second region 95. In one embodiment, the second counter doped layer 15*a* is formed using epitaxial growth. The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxially formed second counter doped layer 15*a*, and the horizontally orientated portion 20*b* for the first diode junction portion 20*b*, 25*b* of the second diode 50*b* can be a type IV semiconductor containing material layer. For example, the epitaxially formed in situ doped n-type semiconductor material 15*b* and the horizontally orientated portion 20*b* for the first diode junction portion 20*b*, 25*b* that is doped to a p-type conductivity may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. A number of different sources may be used for the epitaxial deposition of the in situ doped n-type semiconductor material and the p-type semiconductor material for the material layers formed in the second region 95. In some embodiments, the gas source for the deposition of an epitaxially formed in situ doped n-type semiconductor material and/or p-type semiconductor material may include silicon (Si) deposited from silane, disilane, trisilane, tetrasilane, hexachlorodisilane, tetrachlorosilane, dichlorosilane, trichlorosilane, disilane and combinations thereof. In other examples, when the in situ doped n-type or p-type semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking.

The epitaxially formed second counter doped layer 15*b*, and the material layer for providing the horizontally orientated portion 20*b* for the first diode junction portion 20*b*, 25*b* of the second diode 50*b* can each be doped using ion implantation or may be doped in situ. By "in-situ" it is meant that the dopant that dictates the conductivity type of the material layer is introduced during the process step, e.g., epitaxial deposition, which forms the material layer. As noted above, the second counter doped layer 15*a* is typically doped to an n-type conductivity. The n-type gas dopant source may include arsine ($A_sH_3$), phosphine ($PH_3$). The horizontally orientated portion 20*b* for the first diode junction portion 20*b*, 25*b* of the second diode 50*b* is typically doped to a p-type conductivity. A p-type dopant, such as borane and diborane gas, may be employed to in situ dope the p-type semiconductor material.

The second counter doped layer 15*b* may have a thickness ranging from 5 nm to 50 nm. The thickness of the material layer for the horizontally orientated portion 20*b* for the first diode junction portion 20*b*, 25*b* of the second diode 50*b* typically ranges from 10 nm to 100 nm.

Figure 6:
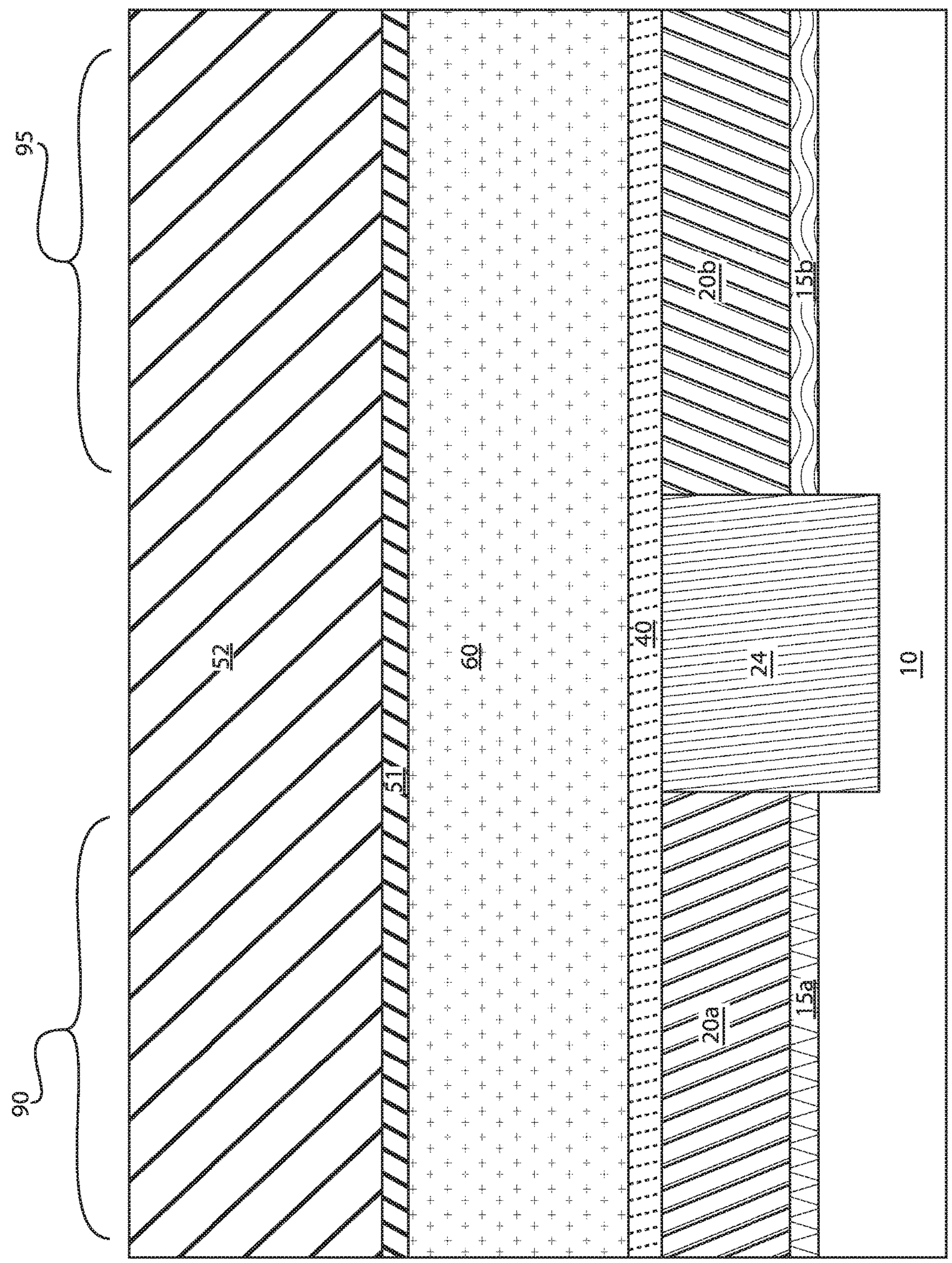
FIG. 6 is a side cross-sectional view depicting one embodiment of forming a material stack on the structure depicted in FIG. 5.

FIG. 6 depicts one embodiment of forming a material stack on the structure depicted in FIG. 5. In some embodiments, the material stack may include a first dielectric spacer layer that provides the first spacer 40 (also referred to as bottom spacer), a sacrificial structure layer 60, a second dielectric spacer layer 51 and a cap dielectric layer 52. Each of the aforementioned layers may be formed atop the structure depicted in FIG. 6 using a deposition process, such as chemical vapor deposition (CVD), plasma enhanced chemical vapor deposition (PECVD), metal organic chemical vapor deposition (MOCVD), room temperature chemical vapor deposition (RTCVD), high density plasma chemical vapor deposition (HDPCVD) and combinations thereof.

The first dielectric spacer layer that provides the first spacer 40 may be composed of any dielectric material, and in some instances may be composed of silicon oxide or silicon nitride. In some embodiments, the first spacer 40 can be composed of a low-k material. As used herein, the term "low-k" denotes a dielectric material having a dielectric constant equal to the dielectric constant of silicon oxide ($SiO_2$) or less. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. The thickness of the first dielectric spacer layer may range from 5 nm to 20 nm.

The sacrificial structure layer 60 may be composed of any material that can be removed selectively to the first dielectric spacer layer. In some embodiments, the sacrificial gate structure layer 60 may be composed of a silicon containing material, such as amorphous silicon (α-Si).

The second dielectric spacer layer 51 is similar to the first dielectric spacer layer. For example, the sacrificial spacer layer 51 may be composed of silicon oxide or silicon nitride. The cap dielectric layer 52 in some examples may be composed of an oxide, such as silicon oxide. The selection of the composition of the cap dielectric layer 52 and the second dielectric spacer layer 51 can be selected to provide that the cap dielectric layer 52 can be removed by an etch process that is selective to the second dielectric spacer layer 51. The second dielectric spacer layer 51 protects the sacrificial structure layer 60 from being etched by the process steps that remove the cap dielectric layer 53.

Figure 7:
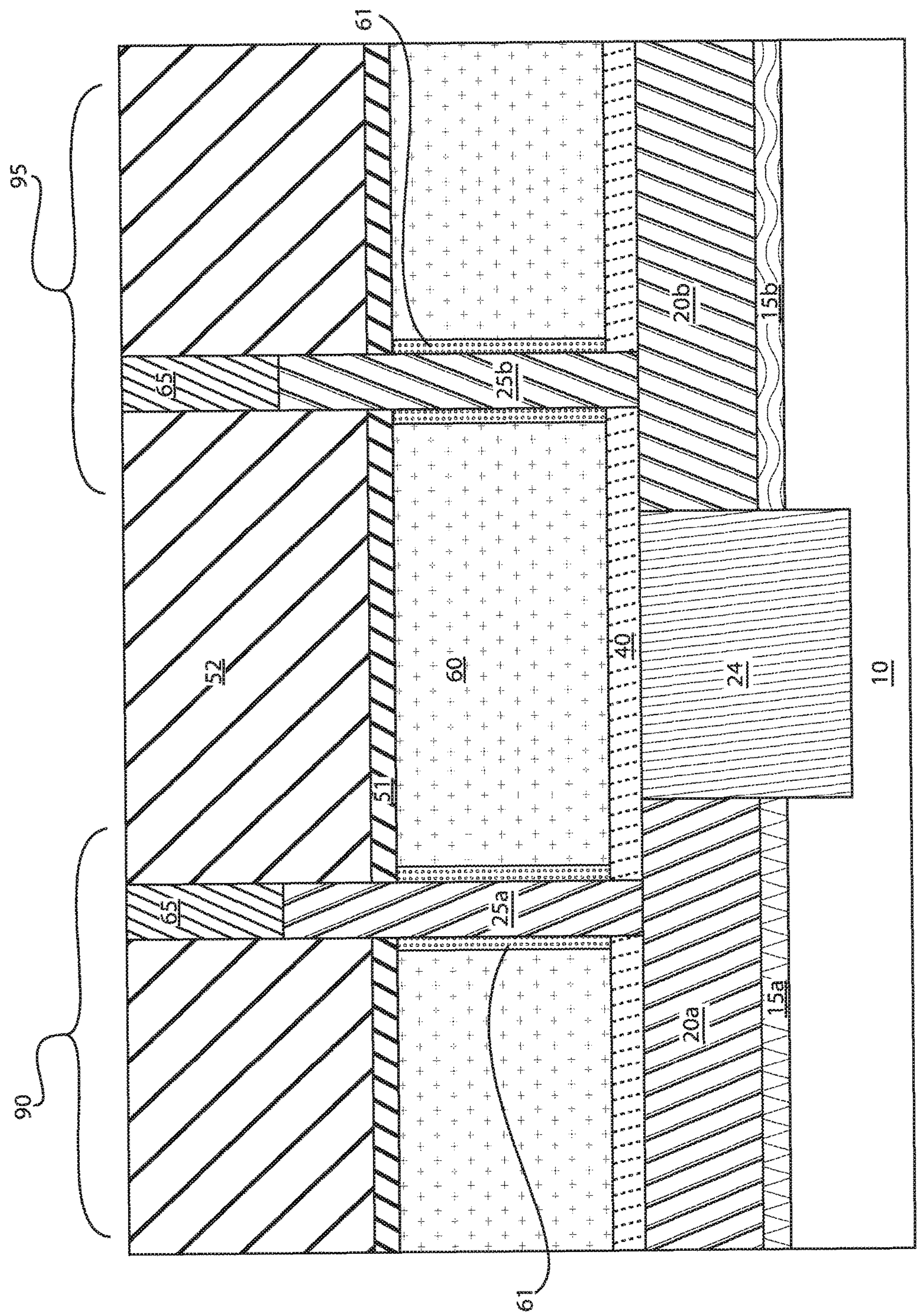
FIG. 7 is a side cross-sectional view depicting one embodiment of forming fin structures.

FIG. 7 depicts forming semiconductor fin structures 25*a*, 25*b* for the vertically orientated portions 25*a*, 25*b* of the first diode junction portion for the first diode 50*a* in the first region 90 and the second diode 50*b* in the second region 95. The reference numbers 25*a*, 25*b* may be used to refer to the semiconductor fin structures and the vertically orientated portions 25*a*, 25*b* of the first diode junction portion 20*a*, 25*a*, 20*b*, 25*b* interchangeably. The fin structures 25*a*, 25*b* provide the vertically orientated portions for the first and second diodes 50*a*, 50*b* of the ESD diode pair 100. In some embodiments, forming the fin structures 25*a*, 25*b* may begin with forming fin structure openings through the material stack. The fin structure openings are formed using deposition, photolithography and etch processes. First, an etch mask is formed atop the material stack including the sacrificial structure layer 60 having openings exposing the portions of the material stack, in which the fin structure openings are formed. Specifically, a etch mask can be produced by applying a photoresist to the surface to be etched; exposing the photoresist to a pattern of radiation; and then developing the pattern into the photoresist utilizing conventional resist developer to produce the etch mask. Once the patterning of the photoresist is completed, the sections covered of the material stack covered by the etch mask are protected while the exposed regions are removed using an etching process that removes the unprotected regions. In some embodiments, the etch process may be an anisotropic etch that removes the exposed portions of the dielectric cap layer 52, the second dielectric spacer layer 51, and the sacrificial gate layer 60, as well as a portion of the first spacer layer 40 to expose a surface of the horizontally orientated portions 20*a*, 20*b* of the first diode junction portion 20*a*, 20*b*, 25*a*, 25*b* for the first and second diodes 50*a*, 50*b*. In some embodiments, the etch process for forming the fin structure openings may be selective to the material of the horizontally orientated portions 20*a*, 20*b* of the first diode junction portion 20*a*, 20*b*, 25*a*, 25*b* for the first and second diodes 50*a*, 50*b*. For example, the etch process for forming the fin structure openings can be a reactive ion etch process.

Still referring to FIG. 7, following the formation of the fin structure openings, a thermal oxidation process forms a dielectric surface 61 of the sidewall surface of the sacrificial gate layer 60 that are exposed within the fin structure openings. In the embodiments in which the sacrificial structure layer 60 is composed of a silicon containing material, the dielectric surface 61 may be composed of an oxide, such as silicon oxide.

In a following process step, the fin structures 25*a*, 25*b* are formed filling the fin structure openings using an epitaxial deposition process that employs the exposed surface of the horizontally orientated portions 20*a*, 20*b* of the first diode junction portion 20*a*, 20*b*, 25*a*, 25*b* for the first and second diodes 50*a*, 50*b* at the base of the fin structure openings as an epitaxial deposition growth surface. The epitaxial semiconductor material that provides the fin structures 25*a*, 25*b* does not form on dielectric surfaces, such as the dielectric cap layer 52 or the dielectric surface 61 of the sacrificial structure layer 60. The epitaxial growth process for forming the fin structures 25*a*, 25*b* is similar to the epitaxial growth process that is described above for forming the horizontally orientated portions 220*b* of the first diode junction portion 20*a*, 20*b*, 25*a*, 25*b* for the second diode 50*b* and the second counter doped layer 15*b*. Therefore, the above description for epitaxially forming the first source/rain region 20*b* and the second counter doped layer 15 is suitable for describing at least one method of the epitaxial deposition processes used to form the fin structures 25*a*, 25*b*.

The geometry and composition of the fin structures 25*a*, 25*b* that are formed in FIG. 7 have been described in greater detail with reference to FIGS. 3A and 3B. In some embodiments, the fin structure 25*a* of the first diode 50*a* that is present within the first region 90 has the same composition as the horizontally orientated portion 20*a* of the first diode junction portion 20*a*, 20*b* for the first diode 50*a*. In some embodiments, the fin structure 25*b* of the second diode 50*b* that is present within the second region 95 has the same composition as the horizontally orientated portion 20*b* of the first diode junction portion 20*b*, 25*b* for the second diode 50*b*. The semiconductor fin structures 25*a*, 25*b* typically are doped to the same conductivity type as the horizontally oriented portions 20*a*, 20*b* of the first diode junction portion 20*a*, 20*b*, 25*a*, 25*b* for the first and second diodes 50*a*, 50*b*.

In some embodiments, the fin structure 25*a* being formed in the first region 50*a* has the same composition as the fin structure 25*b* being formed in the second region 50*b*. In other embodiments, the fin structure 25*a* being formed in the first region 50*a* has a different composition as the fin structure 25*b* being formed in the second region 50*b*. Typically, the fin structure 25*a* in the first device region 50*a* is doped, e.g., n-type doped, to a different conductivity type than the second fin structure 25*b*, e.g., p-type doped, formed in the second device region 50*b*.

To provide that the fin structures 25*a*, 25*b* have different epitaxial compositions, i.e., base compositions, e.g., silicon or germanium or type III-V composition, and/or conductivity types, e.g., n-type or p-type, block masks may be employed. For example, a first block mask, e.g., photoresist mask, may be formed over the second region 95 protecting the fin structure opening present within that region, while a first epitaxial deposition process forms a fin structure 25*a* within the first region 90. Thereafter, the first block mask may be removed, and a second block mask may be formed exposing the fin structure opening in the second region 95 while covering the fin structure 25*a* previously formed in the first region 90. In this example, a second epitaxial deposition process may be used to form the fin structure 25*b* in the second region 95 having a different composition than the fin structure 25*a* formed by the first epitaxial deposition process in the first region 90.

In some embodiments, the pitch P1 separating adjacent fin structures 25*a*, 25*b* is selected to provide that the devices are positioned at less than the contacted gate pitch. In some embodiments, the pitch P1 separating the adjacent fin structures 25*a*, 25*b* may range from 10 nm to 60 nm. In yet another embodiment, the pitch P1 separating the adjacent fin structures 25*a*, 25*b* may range from 25 nm to 40 nm.

FIG. 7 further depicts recessing the epitaxially formed fin structures 25*a*, 25*b*, and forming a dielectric cap 65 on the recessed surfaces of the fin structures 25*a*, 25*b*. The fin structures 25*a*, 25*b* may be recessed using an etch that is selective to the cap dielectric layer 52. Etching the epitaxially formed fin structures 25*a*, 25*b* forms a recess in the upper portions of the fin structure openings. The recess is filled with a deposited dielectric material to provide the dielectric cap 65. In some embodiments, the dielectric cap 65 may be composed of a nitride, such as silicon nitride, that is deposited using chemical vapor deposition (CVD), such as plasma enhanced chemical vapor deposition (PECVD).

Figure 8:
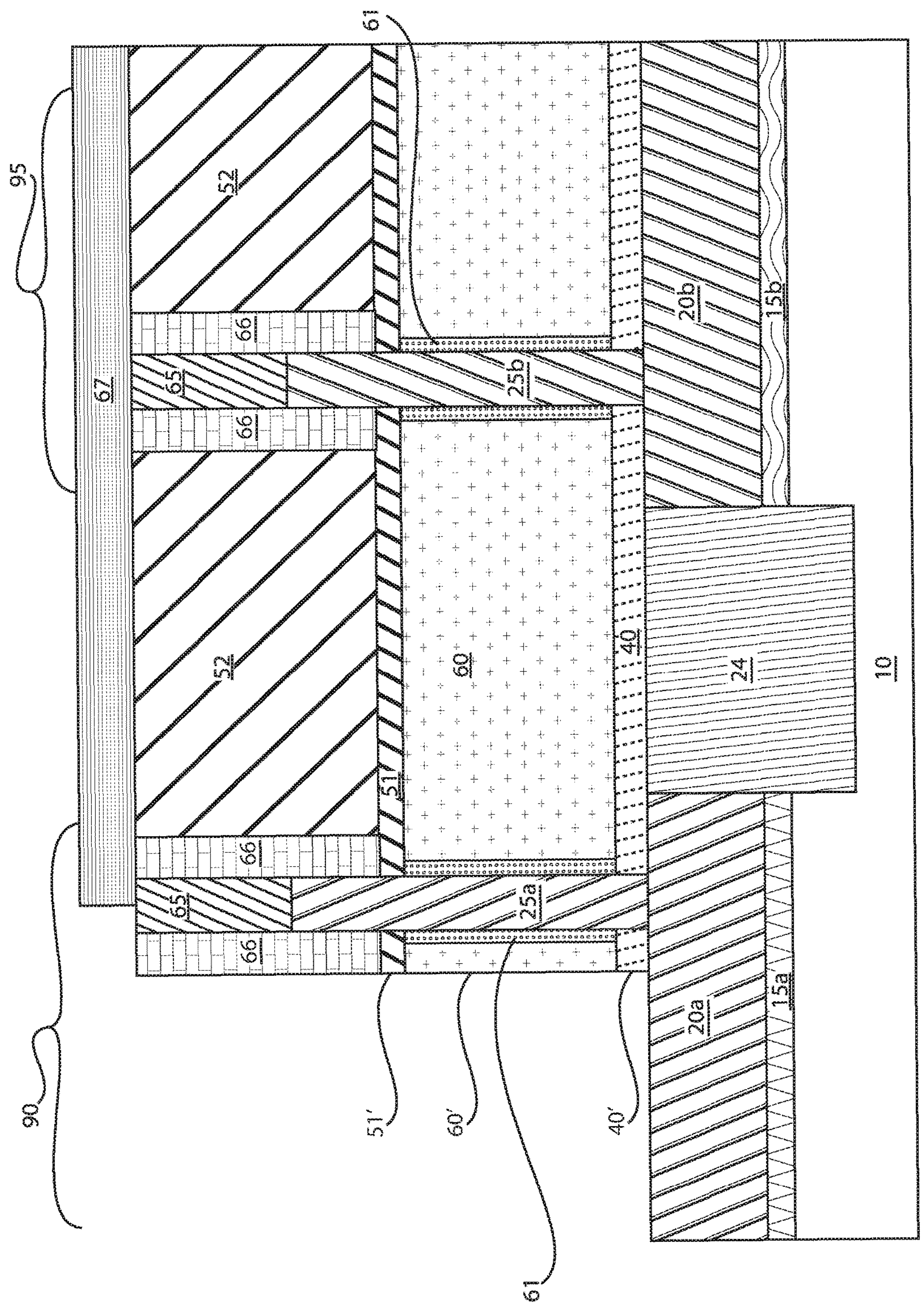
FIG. 8 is side cross-sectional view depicting one embodiment of removing a portion of the material stack to expose a doped surface within the first region of the substrate, while the material layers within the second region of the substrate are protected with a block mask.

Fin spacers 66 may then be formed on upper portions of the fin structures 25*a*, 25*b*, as depicted in FIG. 8. In some embodiments, forming the fin spacers 66 may begin with removing the cap dielectric layer 52 with an etch process, such as an etch process that is selective to the second dielectric spacer layer 51. Removing the cap dielectric layer 52 exposes upper sidewalls of the fin structures 25*a*, 25*b*. The fin spacers 66 are formed on the exposed upper sidewalls of the fin structures 25*a*, 25*b* using a conformal deposition process, such as plasma enhanced chemical vapor deposition (PECVD), following by an anisotropic etchback process, such as reactive ion etch.

After forming the fin spacers 66, a second cap dielectric layer 21' may be formed having an upper surface that is coplanar with the upper surface of the fin spacers 66. The second cap dielectric layer 52' is similar to the original cap dielectric layer 52, and may have the same composition as the original cap dielectric layer 52. For example, the second cap dielectric layer 52' may be composed of an oxide, such as silicon oxide. The second cap dielectric layer 52' may be deposited using chemical vapor deposition, and may be planarized by a process, such as chemical mechanical planarization.

FIG. 8 also depicts one embodiment of removing a majority of the material stack that includes the sacrificial structure layer 60 from the first region 90. FIG. 8 depicts one embodiment of removing a portion of the material stack to expose the horizontally orientated portion 20*a* of the first diode junction portion 20*a*, 25*a* of the first diode 50*a* within the first region 90 of the substrate 10, while the second region 95 of the substrate is protected with a block mask 67. The block mask 67 may be composed of a photoresist material or may be a hard mask, such as silicon oxide or silicon nitride. The block mask 67 may be patterned using photolithography and etching processes.

In some embodiments, an anisotropic etch, such as reactive ion etch (RIE), can remove the exposed portions of the second dielectric cap 52', the second dielectric spacer 51, the sacrificial structure layer 60 and the first dielectric spacer layer 40. The etch process for removing the aforementioned layers is typically selective to the horizontally orientated portion 20*a* of the first diode junction portion 20*a*, 20*b* for the first diode 50*a* in the first region 90. Due to the anisotropic nature of the etch process, a remaining portion of the second dielectric spacer layer 53', a remaining portion of the sacrificial gate layer 60' and a remaining portion of the first dielectric spacer layer 40' is present underlying the fin spacers 66.

Figure 9:
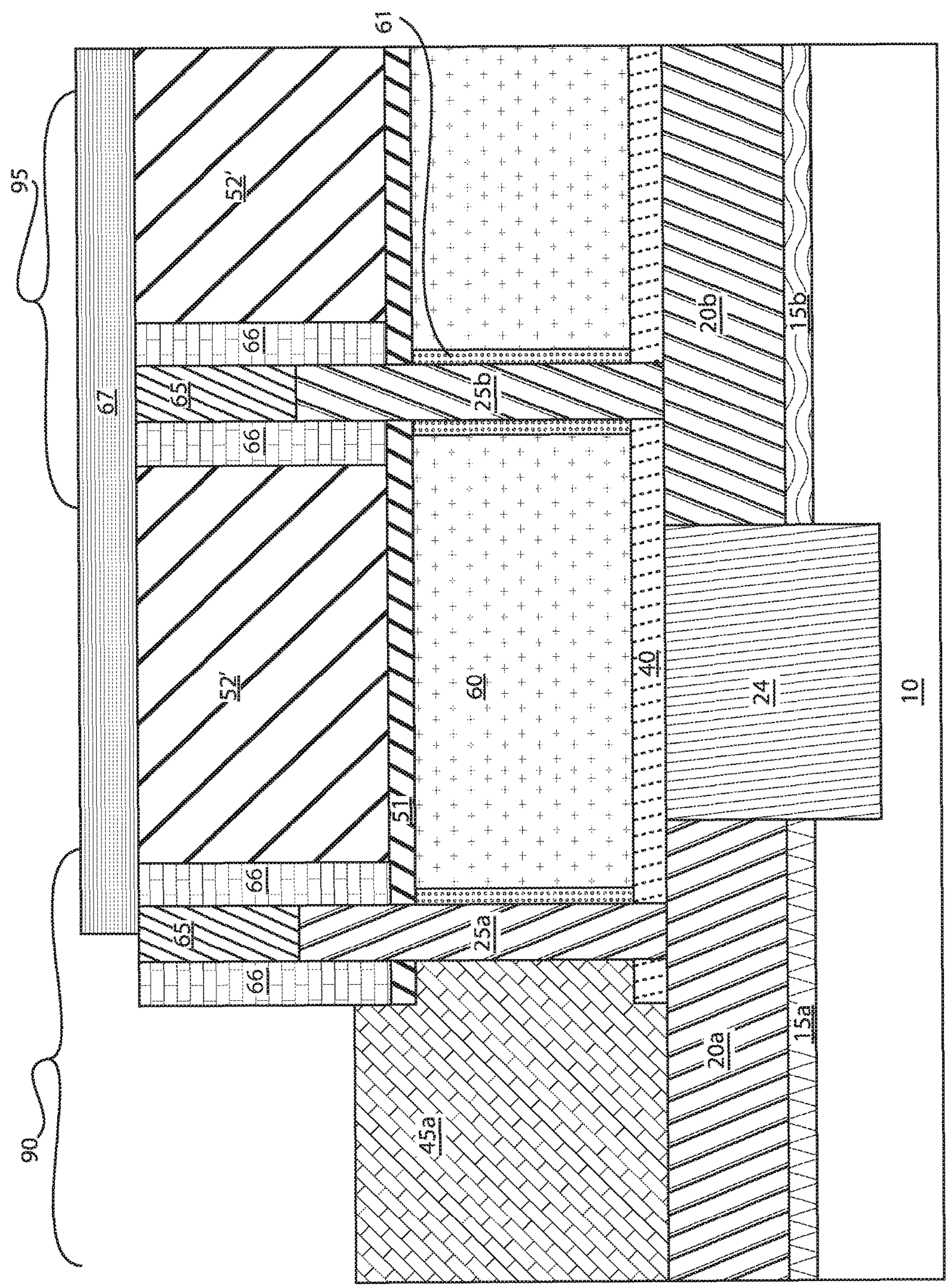
FIG. 9 is a side cross-sectional view depicting one embodiment of epitaxially forming a doped semiconductor material for a portion of the first diode in the first region of the substrate.

FIG. 9 depicts one embodiment of epitaxially forming a doped semiconductor material for a portion of the first diode 50*a* in the first region 90 of the substrate 10. The epitaxially formed doped semiconductor material provides the second diode junction portion 45*a* of the first diode 50*a*, and is in direct contact with the horizontally orientated and vertically orientated portions 20*a*, 25*a* of the first diode junction portion 20*a*, 25*a* of the first diode 50*a* in the first region 90. In some embodiments, prior to forming the second diode portion 45*a* for the first diode 50*a*, the remaining portion of the sacrificial structure layer 60' and the dielectric surface 61 of the sidewall surface of the sacrificial gate layer 60 that is underlying the fin structure 66 may be removed using an isotropic selective etch, such as a plasma etch, gas etch or wet etch process. The etch process may be selective to the fin structure 25*a*. Following the isotropic etch, the outside sidewalls of the fin structures 25*a* are exposed.

The second diode junction portion 45*a* for the first diode 50*a* may be formed in the first region 90 using a low temperature epitaxial growth processes (the top epitaxy can be done at temperatures below 550° C.). The second diode junction portion 45*a* is composed of an epitaxially formed semiconductor material, such as type IV or type III-V semiconductor material. For example, when the second diode junction portion 45*a* for the first diode 50*a* is composed of a type IV semiconductor, the second diode junction portion 45*a* may be composed of silicon, e.g., monocrystalline silicon or single crystalline silicon, germanium, silicon germanium and combinations thereof. For example, when the second diode junction portion 45*a* for the first diode 50*a* is composed of a type III-V semiconductor, the second diode junction portion 45*a* may be composed of InGaAs.

The second diode junction portion 45*a* of the first diode 50*a* may have an opposite conductivity type as the first diode junction portion 20*a*, 25*a* of the first diode 50*a*. For example, when the first diode junction portion 20*a*, 25*a* of the first diode 50*a* has an n-type conductivity, the second diode junction portion 45*a* has a p-type conductivity. In another example, when the first diode junction portions 20*a*, 25*a* of the first diode 50*a* has a p-type conductivity, the second diode junction portion 45*a* has an n-type conductivity.

The methods of forming and doping the second diode junction portion 45*a* is similar to the methods and forming and doping the first diode junction portions 20*a*, 25*a*. Therefore, the above forming methods, e.g., epitaxial forming, and doping method, e.g., in situ doping methods, for producing the first diode junction portion 20*a*, 25*a* is suitable for describing at least one embodiment of forming the second diode junction portion 45*a*.

The second diode junction 45*a* is formed in epitaxial relationship with the both the horizontal portion 20*a* and the vertical portion 25*a* of the first diode junction portion 20*a*, 25*a*. For example, if the first diode junction portion 20*a*, 25*a* has a monocrystalline crystal structure, the second diode junction 45*a* will have a monocrystalline crystal structure. For example, if the material compositions for the first and second diode portions 45*a*, 20*a*, 25*a* are substantially similar, the lattice structure for the second diode portion 45*a* will substantially match the lattice structure of the first diode junction portion 20*a*, 25*a*.

Epitaxial growth of opposite dopant in-situ doped epitaxy on exposed source semiconductor surface and from n-doped channel sidewall, i.e., epitaxial growth on the (100) bottom surface is faster than on the (110) fin sidewall leading to drawn epitaxy structure. More specifically, epitaxial growth from the bottom up, i.e., from the (100) surface is faster than the sidewall growth off the (110) sidewall if the sidewall is the fin structure 25*a*, 25*b*.

After forming the second diode junction 45*a* in the first region 90 of the substrate, an interlevel dielectric 46 is deposited on the upper surface of the second diode junction 45*a* in the first region 90, and the block mask 67 that was present over the second region 95 of the substrate 10 is removed.

Figure 10:
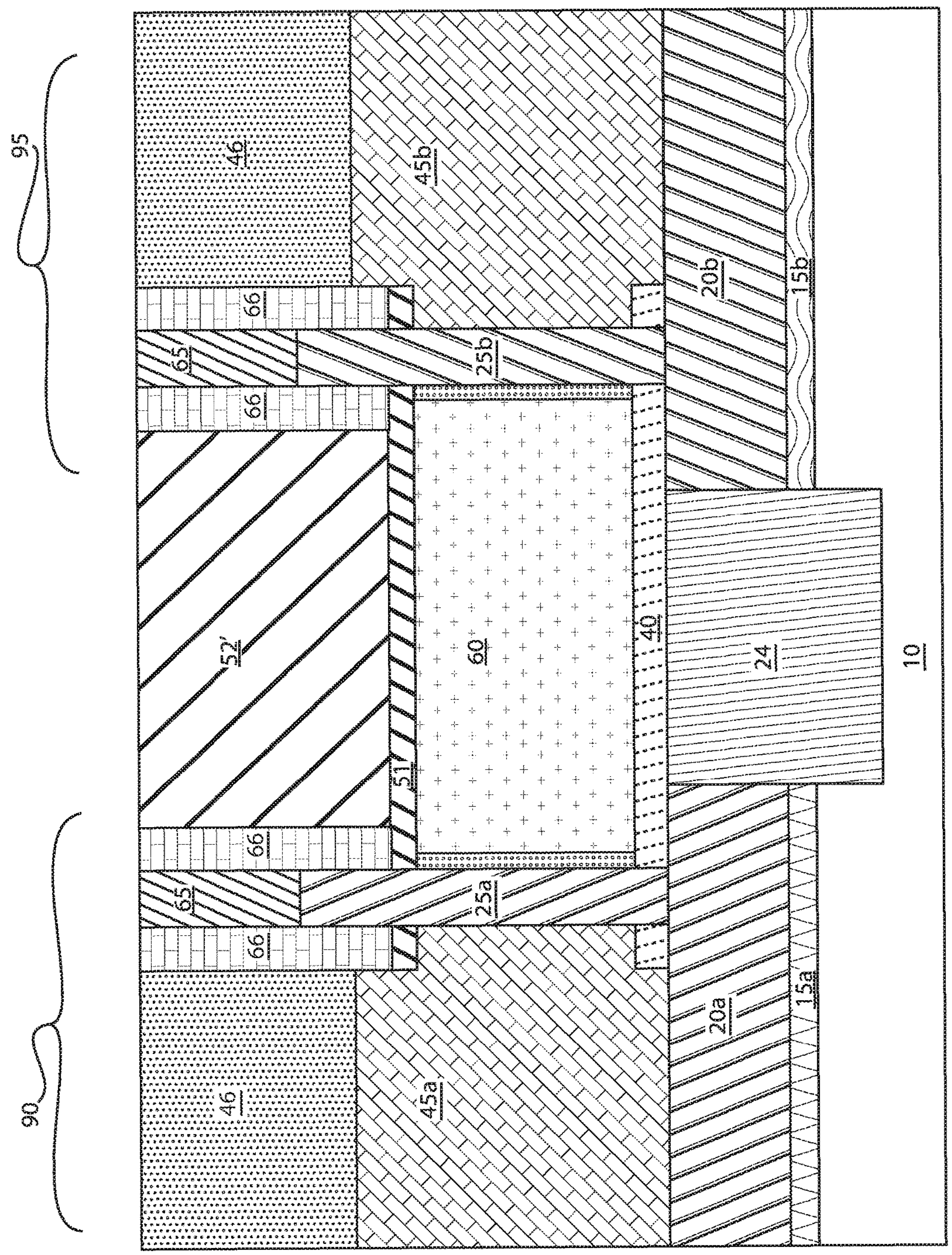
FIG. 10 is a side cross-sectional view depicting one embodiment of epitaxially forming a doped semiconductor material for a portion of the second diode in the second region of the substrate

FIG. 10 depicts one embodiment of epitaxially forming a doped semiconductor material for a portion of the second diode in the second region 95 of the substrate 10. The epitaxially formed doped semiconductor material provides the second diode junction portion 45*b* of the second diode 50*b*, and is in direct contact with the horizontally orientated and vertically orientated portions 20*b*, 25*b* of the first diode junction portion 20*b*, 25*b* of the second diode 50*b* in the second region 95. In some embodiments, prior to forming the second diode portion 45*b* for the second diode 50*b*, a bock mask is formed over the first region of the substrate 90, leaving the second region 95 of the substrate exposed. An anisotropic etch, such as reactive ion etch (RIE), can remove the exposed portions of the second dielectric cap 52', the second dielectric spacer 51, the sacrificial structure layer 60 and the first dielectric spacer layer 40 that are present in the second region 95 of the substrate. The etch process for removing the aforementioned layers is typically selective to the horizontally orientated portion 20*b* of the first diode junction portion 20*b* for the second diode 50*b* in the second region 95. The remaining portion of the sacrificial structure layer 60' and the dielectric surface 61 of the sidewall surface of the sacrificial gate layer 60 that is underlying the fin structure 66 in the second region 95 may be removed using an isotropic selective etch, such as a plasma etch, gas etch or wet etch process. The etch process may be selective to the fin structure 25*b*. Following the isotropic etch, the outside sidewalls of the fin structures 25*b* are exposed.

The second diode junction portion 45*b* for the second diode 50*b* may be formed in the first region 90 using a low temperature epitaxial growth process. The second diode junction portion 45*b* is composed of an epitaxially formed semiconductor material, such as type IV or type III-V semiconductor material. For example, when the second diode junction portion 45*b* for the second diode 50*b* is composed of a type IV semiconductor, the second diode junction portion 45*b* may be composed of silicon, e.g., monocrystalline silicon or single crystalline silicon, germanium, silicon germanium and combinations thereof.

The second diode junction portion 45*b* of the second diode 50*b* may have an opposite conductivity type as the first diode junction portion 20*b*, 25*b* of the second diode 50*b*. For example, when the first diode junction portion 20*b*, 25*b* of the second diode 50*b* has a p-type conductivity, the second diode junction portion 45*b* has an n-type conductivity.

Therefore, the above described forming methods, e.g., epitaxial forming, and doping method, e.g., in situ doping methods, for producing the first diode junction portion 20*a*, 25*a* is suitable for describing at least one embodiment of forming the second diode junction portion 45*b*. The second diode junction portion 45*b* is formed in epitaxial relationship with the both the horizontal portion 20*b* and the vertical portion 25*b* of the first diode junction portion 20*b*, 25*b*.

An interlevel dielectric 46 is formed over the second diode junction portion 45*b* in the second region 95 of the substrate 10.

Figure 11:
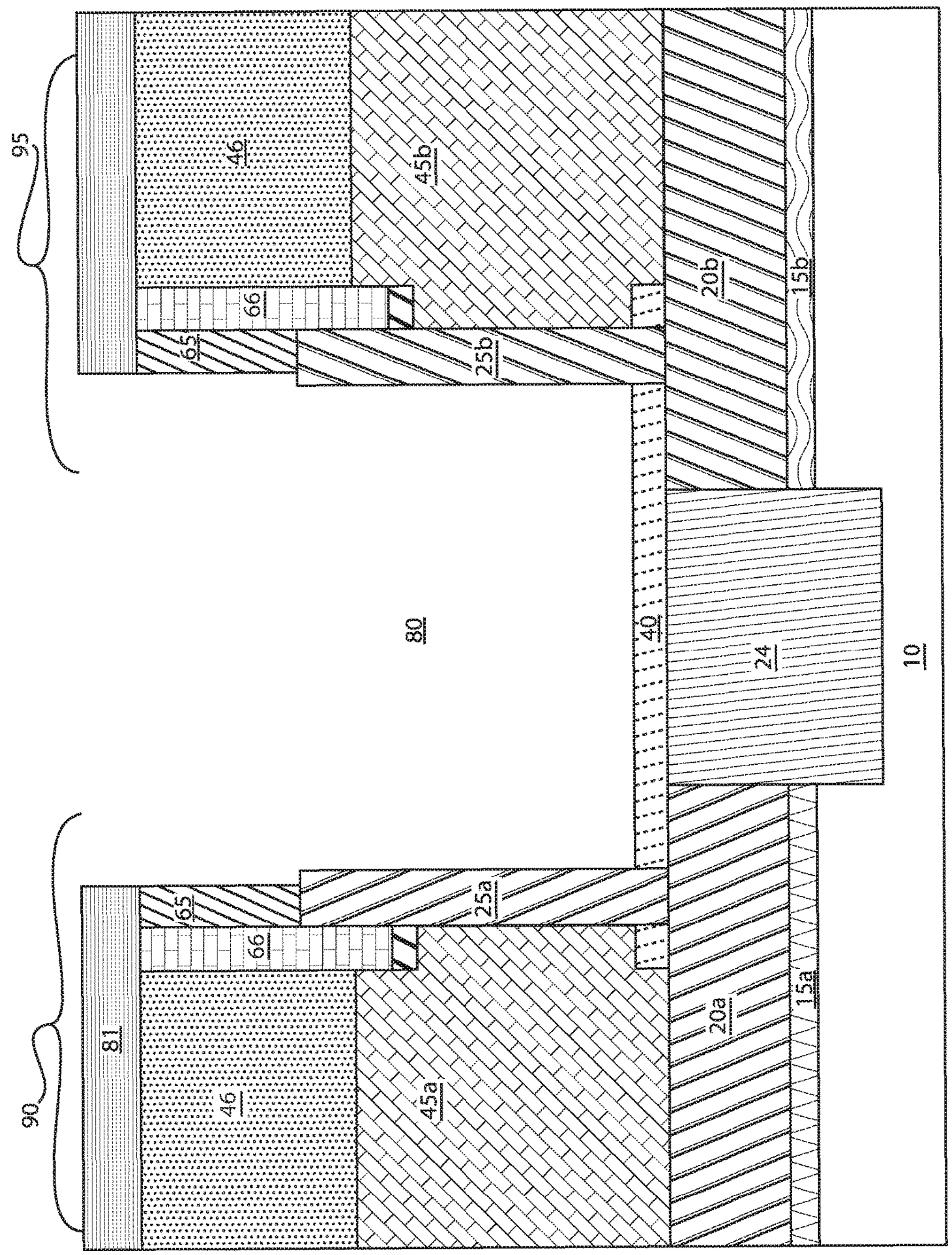
FIG. 11 is a side cross-sectional view depicting one embodiment of removing a portion of the material stack that is present between the adjacent fin structures to provide a trench opening for forming the common electrical contact.

FIG. 11 depicts one embodiment of removing a portion of the material stack 52, 51, 60 that is present between the adjacent fin structures 25*a*, 25*b* to provide a trench opening 80 for forming the common electrical contact 30. In some embodiments, an etch mask 81 is formed protecting the first and second region 90, 95 of the substrate 10, the etch mask 81 leaving the portion of the substrate 10 including the isolation region exposed. An etch process, such as reactive ion etch, can then remove the cap dielectric layer 52, the inside fin spacer 66 that are present between the adjacent fin structures 25*a*, 25*b*, as well as the second dielectric spacer layer 51 and the remaining portion of the sacrificial structure layer 60. The etch process may be selective to the first dielectric spacer layer 40.

Figure 12:
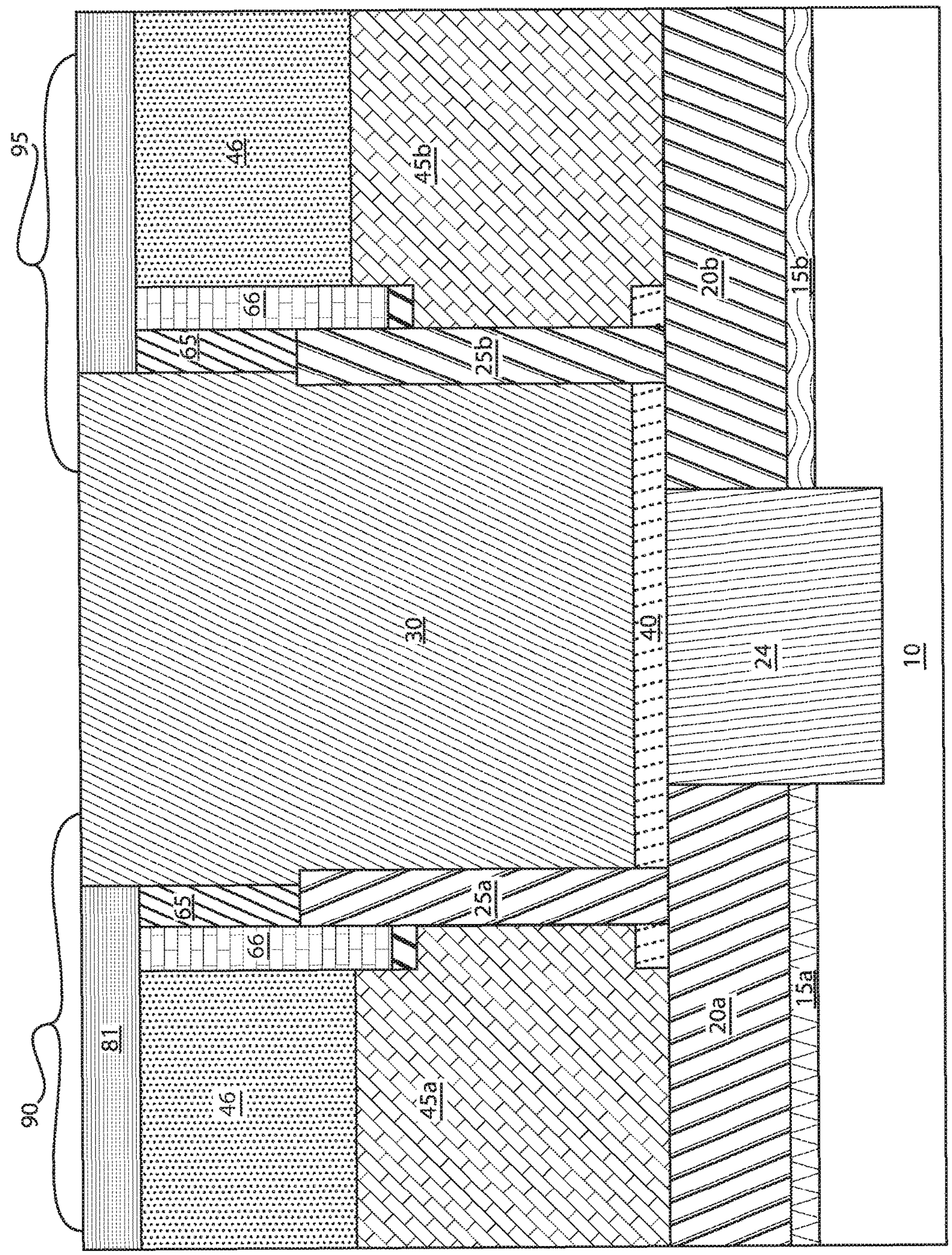
FIG. 12 is a side cross-sectional view depicting one embodiment of forming the common electrical contact to the fin structures in the first and second regions of the substrate.

FIG. 12 depicts one embodiment of forming the common electrical contact 30 to the fin structures 25*a*, 25*b* in the first and second regions 90, 95 of the substrate 10. The common electrical contact 30 may be a metal or metal nitride. For example, the common electrical contact may be composed of tungsten, tantalum, titanium, aluminum, copper, platinum, gold, silver, as well as other metals used in interconnects. Examples of metal nitrides that are suitable for forming the common electrical contact 30 may include titanium nitride, tungsten nitride and tantalum nitride. Other examples of compositions suitable for the common electric contact 30 may include TiAl, HfN, TiAlN, Ru, Pt, Mo, Co and alloys and combinations thereof. The material layer for the common electrical contact 30 may be deposited using physical vapor deposition, such as sputtering. In yet further examples, the material layer for the common electrical contact 30 may be deposited using plating, electroplating, electroless deposition, and combinations thereof. In other examples, the material layer for the common electrical contact 30 may be deposited by CVD, e.g., plasma enhanced chemical vapor deposition (PECVD).

Following deposition of the material layer for the common electrical contact 30, an etch process, such as reactive ion etch (RIE), may recess the material layer to the appropriate height. An interlevel dielectric layer 46 may be deposited on the recessed surface of the common electrical contact 30.

Referring to FIGS. 3A and 3B, following formation of the common electrical contact 30, via contacts 34*a*, 34*b*, 35 may be formed to each of the first and second diodes 50*a*, 50*b*. A first via contact 34*a* may be formed to the second diode junction portion 45*a* of the first diode 50*a* in the first region 90. A second via contact 34*b* may be formed to the second diode junction portion 45*b*. A common via contact 35 is formed to the common electrical contact 30.

The via contacts 34*a*, 34*b*, 35 may be produce by forming a via opening through the interlevel dielectric layer 46; and filling the via opening with an electrically conductive material. The via opening may be formed using photolithography and etch processes. For example, a photoresist mask may be formed exposing the portion of the dielectric material layers in which the via opening is to be formed, wherein following formation of the photoresist mask, the via opening may be etched into the interlevel dielectric using an etch process, such as reactive ion etch. The via opening may be filled with a doped semiconductor material, such as n-type doped polysilicon, or a metal, such as copper, aluminum, titanium, tungsten, platinum or combinations thereof, to form the via contacts 34*a*, 34*b*, 35. The electrically conductive material may be deposited into the via opening using physical vapor deposition (PVD). Examples of PVD processes suitable for depositing the metal for the via contacts 34*a*, 34*b*, 35 include plating, electroplating, electroless plating, sputtering and combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a structure and method for forming a VERTICAL TRANSISTOR DUAL DIODE STRUCTURE FOR ELECTROSTATIC DISCHARGE CIRCUIT PROTECTOR, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An electrical device comprising:

a first region of a substrate and a second region of the substrate;

a first diode in the first region of the substrate, the first diode including a first diode junction portion having vertically orientated and horizontally orientated portions of a first conductivity and a second diode junction portion of a second conductivity in direct contact with both of the vertically orientated and horizontally orientated portions of the first diode junction portion;

a second diode in the second region of the substrate, the second diode including a first diode junction portion having vertically orientated and horizontally orientated portions of the second conductivity and a second diode junction portion having the first conductivity in direct contact with both of the vertically orientated and horizontally orientated portions of the first diode junction portion; and a common electrical contact is in direct contact with the first diode junction portion for each of the first diode and the second diode.

2. The electrical device of claim 1, wherein the electrical device is an electrostatic device of a diode pair.

3. The electrical device of claim 1, wherein the horizontally orientated portion of the first diode junction portion for the first diode is present on an upper surface of the substrate, and the horizontally orientated portion of the first diode junction portion for the second diode is present on the upper surface of the substrate, the horizontally orientated portion of the first diode junction portion for the first diode being separated from the horizontally orientated portion of the first diode junction portion for the second diode by a shallow trench isolation (STI) region.

4. The electrical device of claim 3, wherein a counter doped layer is present underlying each of the horizontally orientated portion of the first diode junction portion for the first diode and the horizontally orientated portion of the first diode junction portion for the second diode.

5. The electrical device of claim 1, wherein respective vertically orientated portions for the first diode junction portion of the first and second diodes are composed of a semiconductor fin structure.

6. The electrical device of claim 5, wherein the semiconductor fin structure comprises a type IV semiconductor material.

7. The electrical device of claim 1, wherein the common electrical contact is comprised of a metal containing material.

8. The electrical device of claim 7, wherein the common electrical contact is present directly over an isolation region separating the first region of the substrate from the second region of the substrate.

9. The electrical device of claim 7 further comprising a first contact to the second diode junction portion of the first diode, and a second contact that is separate from the first contact to the second diode junction portion of the second diode.

10. The electrical device of claim 9, wherein the first conductivity type is p-type and the second conductivity type is n-type.

11. The electrical device of claim 10, wherein the common electrical contact is an input/output of the device, the first contact is connected to a positive supply voltage (VSS) and the second contact is connected to a ground (VDD).

12. An electronic device comprising:

a first diode in a first region of a substrate, the first diode including a first diode junction portion having an L-shaped geometry with vertically orientated portions and horizontally orientated portions having a first conductivity type, and a second diode junction portion having a second conductivity type in contact with the first diode junction portion having the L-shaped geometry and the first conductivity type;

a second diode in a second region of the substrate, the second diode including a first diode junction portion having an L-shaped geometry with vertically orientated and horizontally orientated portions having the second conductivity type and a second diode junction portion in contact with first diode junction portion having the L-shaped geometry and the second conductivity type; and a common electrical contact in direct contact with the vertically orientated portions for the first diode having the first conductivity type and the vertically orientated portions for the second diode having the second conductivity type.

13. The electronic device of claim 12, wherein the common electrical contact is present directly over an isolation region separating the first region of the substrate from the second region of the substrate.

14. The electronic device of claim 12 further comprising a first contact connected to the second diode junction portion of the first diode, and a second contact that is separate from the first contact connected to the second diode junction portion of the second diode.

15. The electronic device of claim 12, wherein the first conductivity type is p-type and the second conductivity type is n-type, and wherein the common electrical contact is an input/output of the device, a first contact is connected to the second diode junction portion of the first diode, the first contact is connected to a positive supply voltage (VSS); and a second contact that is separated from the first contact, the second contact is connected to the second diode junction portion of the second diode, the second contact is connected to a ground (VDD).

16. A method of forming an electric static discharge (ESD) diode pair comprising:

forming a first diode including a first diode junction portion having vertically orientated and horizontally orientated portions with a first conductivity type and a second diode junction portion in direct contact with both of the vertically orientated and horizontally orientated portions of the first diode junction portion;

forming a second diode in a second region of the substrate, the second diode including a first diode junction portion having vertically orientated and horizontally orientated portions of a second conductivity type and a second diode junction portion having the first conductivity type in direct contact with both of the vertically orientated and horizontally orientated portions of the first diode junction portion having the second conductivity type; and forming a common electrical contact in direct contact with the vertically orientated portions of the first diode junction portions for the first and second diodes.

17. The method of claim 16, wherein fin structures that provide the vertically orientated portions of the first diode junction portion for the first and second diodes are epitaxially formed.

18. The method of claim 17, wherein the fin structures for the first and second diodes are separated by a pitch ranging from 25 nm to 40 nm.

19. The method of claim 17 further comprising forming a first contact connected to the second diode junction portion of the first diode, and forming a second contact that is separated from the first contact, the second contact connected to the second diode junction portion of the second diode.

20. The method of claim 19, wherein the first conductivity type is p-type and the second conductivity type is n-type, and wherein the common electrical contact is an input/output of the ESD diode pair, the first contact is connected to a positive supply voltage (VSS) and the second contact is connected to a ground (VDD).

* * * * *